HIGH-SPEED SCANNING SYSTEM
Filed Oct. 23, 1965
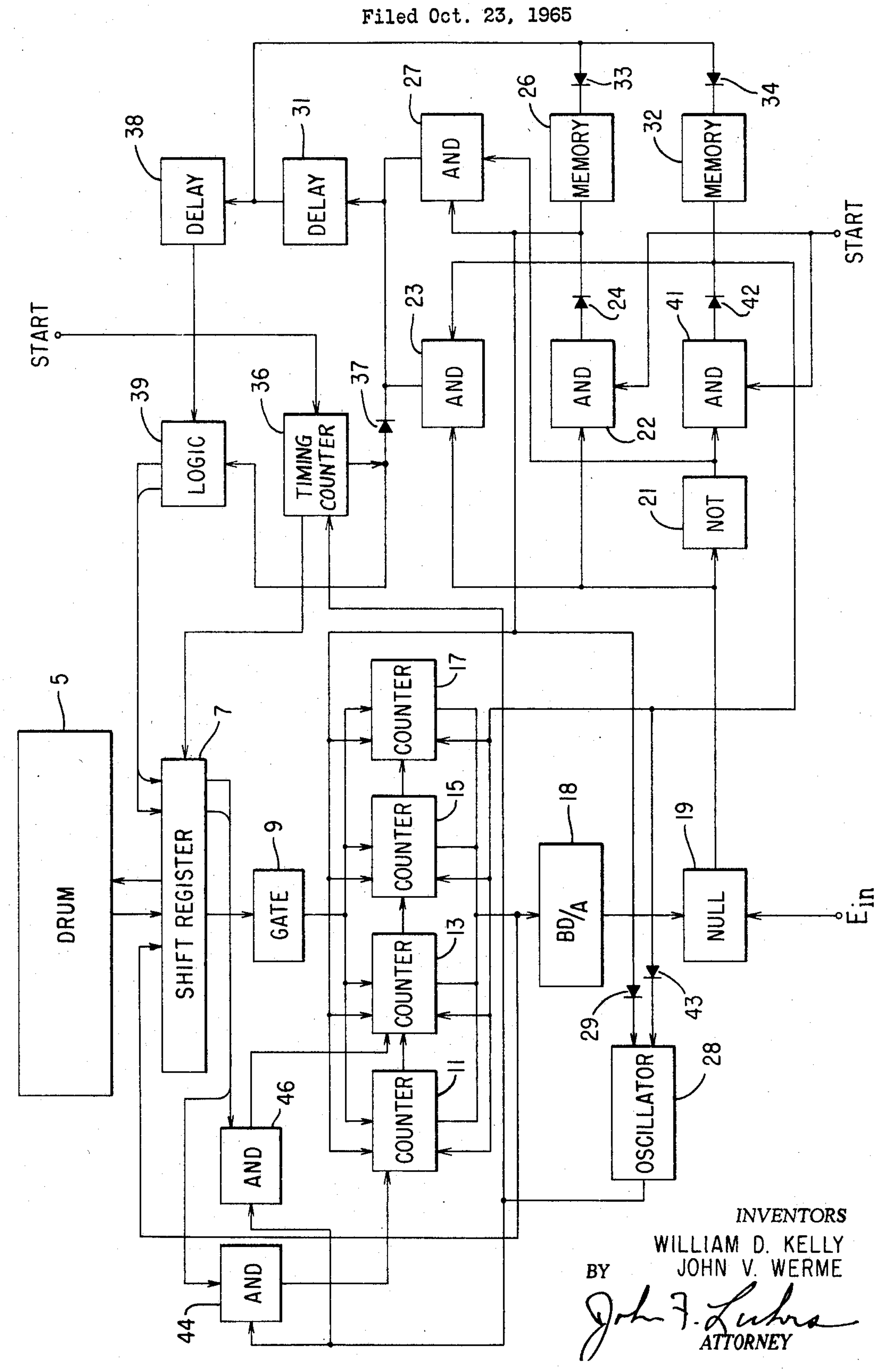
INVENTORS
WILLIAM D. KELLY
JOHN V. WERME
BY
John F. Lukra
ATTORNEY 3,503,066
HIGH-SPEED SCANNING SYSTEM William D. Kelly, Eastlake, and John V. Werme, Painesville, Ohio, assignors to Bailey Meter Company, a corporation of Delaware Filed Oct. 23, 1965, Ser. No. 503,107
Int. Cl. G08c 7/00
U.S. Cl. 340—347 12 Claims

ABSTRACT OF THE DISCLOSURE

A system for the high-speed scanning of a multitude of analog input signals and their conversion to digital representations. The time required for the digital conversion of each variable being minimized by algebraically adding to the digital representation of each variable at the time of the last scan a count which is proportional to the change in the variable during the increment of time from the last to the next succeeding scan.

This invention relates to a high-speed analog to digital converter. In particular, this invention relates to a system for high-speed scanning of a multitude of analog input signals and their conversion to a digital representation.

With the advent of the closed-loop digital-control system, the problems associated with scanning and converting analog signals has been brought to the forefront. To assure a smooth and continuous flow of data from the measured variables to the final control elements frequent reading of each variable is necessary. Slow scanning, or infrequent scanning, produces a time lag between measurement of the variable and control therefrom. In addition, the variable to be controlled will be corrected in steps.

Two well-known analog to digital converters, commonly known as encoders, are the ramp type and the feedback type. The ramp encoder converts the analog input signal to digital equivalent by means of a linear ramp voltage and a timer. The time interval required for the ramp voltage to increase from zero to the magnitude of the analog input signal is measured by the timer. The timing counter starts when the ramp voltage begins and continues to count until the ramp voltage equals the analog input signal, the time between the start and stop pulses to the counter is a linear function of the input signal. Therefore, the number of counts recorded in the timing counter is a digital representation of the analog input signal.

The feedback encoder uses a digital to analog converter in a feedback arrangement. A digital code is continuously generated in a register and converted to an analog voltage by means of a digital to analog converter. A null detector compares this generated analog signal with the analog input signal to be encoded. The complete sequence of operation of the feedback encoder is as follows. First, a control circuit resets the digital register to zero and starts it generating a new digital code. The continually increasing code generated by the register is converted to an analog signal by a digital to analog converter and compared with the input signal by means of a null detector. This operation continues so long as the analog input signal is greater than the generated analog signal. When the generated analog signal becomes greater than the input signal the digital register is turned off and the conversion operation is complete. The code generated by the digital register is a digital representation of the analog input voltage.

When using either of these encoders some time is lost because both start from a zero reference signal. With our invention the unnecessary delay caused by starting the conversion cycle at the lowest possible input signal is eliminated resulting in an increase in the number of times one point can be scanned in a given time interval. In our system the conversion cycle does not start from the lowest value, but rather from the value of the analog input signal of the preceding cycle. Thus, we effect a considerable time saving per conversion and can increase the number of points scanned per second.

Although our invention was developed and perfected on a system operating on the feedback encoder principle it will operate with equal efficiency using an encoder of the ramp type. The following description, therefore, is not intended to limit our invention to feedback encoders.

Our converter operates basically the same as the feedback encoder described previously. There are, however, several exceptions; first, the digital register is not reset to zero, instead the digital representation of the analog input signal from the previous cycle is transferred thereto. An oscillator begins to generate a new code in the digital register not from a zero reference but rather from the transferred value. It continues to operate until either one of two conditions are satisfied, either a null condition exists between the analog input signal and the generated analog signal or the oscillator increases the generated signal by 20 increments. If a null condition is reached before the 20 increment limitation, the oscillator stops and our system follows that previously described; that is, with one exception. The new digital representation of the analog input signal is stored on a magnetic drum for use as the basis for counting in the next cycle.

If the 20 increment limitation stops the oscillator the next scanning cycle contains an additional operation not found in previous feedback encoders. When the oscillator stops before generating an analog signal equal to the analog input signal, the code in the register will be incorrect. This erroneous value, although more nearly correct than the previous one, is stored on the magnetic drum for use in the next cycle. Storing an erroneous value on the magnetic drum causes the digital register to count in the next cycle an order of magnitude ten times that of the previous cycle. Since the elapsed time between conversions of any given point is very short, it is not believed likely that more than two cycles will be needed to reach a null condition.

It is an object of our invention to provide a high-speed analog to digital converter.

It is a further object of our invention to provide an analog to digital converter wherein the conversion begins at the value of the input signal from the previous cycle.

Another object of our invention is to provide an encoder having a digital register that operates until a null condition exists between the analog input signal and a generated signal or until a predetermined number of counts have been added to the previous value.

Another object of our invention is to provide an analog to digital converter wherein the digital register counts in increasingly higher values during subsequent cycles if a null condition has not been reached during the preceding cycle.

Another important feature of our control system is that it generates a digital code equal to the difference between the previously digitized value of the variable and the present digitized value. In digital control, it is often necessary to know this difference to develop the desired control signal. Presently, the most common means of obtaining this difference is by performing a subtraction on the magnetic drum, this requires an additional time consuming step. With our system, however, the difference is generated by the oscillator each time a point is scanned. When a null condition stops the oscillator, the number of pulses it has generated will be proportional to the difference between the last value and the present.

Another object of our invention is to provide an analog to digital converter that generates the difference between the previous value of a variable and the present value.

Various other objects and advantages will be apparent from the following description of our invention and the novel features will be pointed out in the appended claims.

For a complete understanding of our invention reference is made to the following detailed description and the accompanying drawing that shows a block diagram of a high-speed analog to digital converter.

Referring to the figure, we show a rotatable magnetic drum 5 whereon is stored the digital representations of the analog input signals converted during the preceding cycle. Also stored on the magnetic drum 5 are instruction codes for programming the converters operation for each point to be scanned during the next cycle. For converting each analog input signal an instruction code is required to determine the converters's operation for that particular point. These instruction codes consist of logic bits of either a logic ONE or logic ZERO. Throughout the description they will be referred to as an instruction code or instruction data. At the beginning of a conversion, the stored digital representation from the preceding cycles and its associated instruction data are transferred to a shift register, as represented by block 7. From the shift register 7 the stored information is transferred to the counters 11, 13, 15 and 17 through a gate 9 in accordance with the information transferred thereto. Many well-known counters can be used in our system, one such counter has four complementing flip-flops connected in a single chain circuit, input pulses will cause them to proceed through their stable states. Using four flip-flops each counter is capable of counting from 0000 to 1111 which is the binary equivalent of decimal 0 to 15. Since our counters operate from 0 to 9, a circuit is included in each to skip over the last six binary states and the desired decimal counting is obtained. By connecting the four counters in sequence it is possible for our system to count 9,999 digits, but only the numbers 0000 to 3999 are used.

The analog input signals to be converted by our system are all zero based and have a range span of four volts. The digital equivalents are represented in a binary-coded decimal form with the least decimal increment equivalent to one millivolt. Thus, each analog input signal has 3,999 millivolts and its digital eqivalent has 3,999 digits.

In the figure, a pulse to counter 11 has a weight of 1 millivolt as referred to the input signal, a pulse to counter 13 equals 10 millivolts at the input, a pulse to counter 15 has a weight of 100 millivolts and a pulse to counter 17 equals 1000 millivolts at the input signal. The binary-decimal code generated in counters 11, 13, 15 and 17 is converted to an analog equivalent, continuously as it is generated, by a binary-decimal to analog (BD/A) converter 18 connected to the individual counters. A binary-decimal to analog converter, as the name implies, converts binary-decimal codes to their analog voltage equivalents. A typical BD/A converter has 14 logic input circuits that function as switches between 14 constant current supplies of varying magnitude and a common bus. Logic ONE signals to the input circuits cause the switches to be open and no current flows from the current sources. Applying a logic ZERO to any input circuit closes that switch and allows current to flow from a constant current source to the common bus. The magnitude of the current flowing in the common bus depends on which input circuit is at a logic ZERO level. When two or more input circuits are at a logic ZERO level the currents add together; the analog output voltage is developed across an output resistor. In our system, the voltage output of the BD/A converter 18 varies and changes with the binary-decimal code generated in the counters 11, 13, 15 and 17.

The analog output voltage of the BD/A converter 18 connects to a null detector 19, also connected to the null detector 19 in the analog signal to be converted to a binary-decimal code. Null detectors are devices for comparing the magnitude of two analog signals and generating a logic signal depending on the comparison. If the input signal (the analog signal to be converted) is greater than the BD/A converter output, the null detector output will be at a logic ONE level, when the input signal is less than the DB/A converter output the null detector output is logic ZERO. Circuitwise, null detectors are usually very simple devices consisting of a power supply, an amplifier, a logic switch and a constant current supply. The amplifier has a differential input stage with the analog input signals connected thereto. The differential amplifier controls the logic switch that in turn controls whether or not the constant current source connects to an output terminal.

Connected to the output of the null detector 19 is a logic NOT 21 and AND gates 22 and 23. Logic NOT's merely invert the logic level of their inputs, in this case the output of the logic NOT 21 connects to an AND gate 41 and an AND gate 27. An AND gate is a conditional switch, it has two inputs, if both are logic ONE then the output will be logic ONE, if the inputs are at different logic levels then the output will be logic ZERO. The output logic of AND gate 22 connects to a diode 24; the diode, in turn, connects to a Memory unit 26, an AND gate 27, the counters 11, 13, 15 and 17, and to an oscillator 28 through a diode 29. Memory unit 26 has a second logic signal connected thereto, this one from a pulse Delay 31 through a diode 33. A Memory unit 32 also connects to the pulse Delay 31 through a diode 34. Memory units are temporary storage devices for holding a given logic signal; flip-flop circuits are widely used for these devices. Flip-flop circuits have two external terminals, if one terminal is at a logic ZERO level then the other is at a logic ONE level and vice versa. Once a memory unit has been preset there is no longer any need for the input signal, in this case from the pulse Delay 31. If the signal from the pulse Delay 31 is logic ONE, then the signal to AND gate 27 will be logic ZERO.

Pulse Delays are designed to provide a definite length output pulse from an input trigger pulse of indefinite duration. The pulse Delay 31 receives its trigger signal from either the AND gate 23 or 27 or from a counter 36 through a diode 37. Its output pulse connects to a pulse Delay 38 in addition to the Memory units 26 and 32. Pulse Delays 31 and 38 are identical; the pulse Delay 38 connects to a Logic circuit 39.

Logic 39 has two inputs and two outputs, the first input is from the pulse Delay 38 and the second from the counter 36, the outputs of the Logic circuit 39 connects to the shift register 7. The Logic circuit 39 can take many forms, for the purpose of understanding our invention it is further necessary to describe its operation. This explanation will be given shortly.

The counter 36 has two inputs, one from the oscillator 28, the second is a system start signal. The system start signal also connects to the AND gates 22 and 41. The AND gate 41 connects to a diode 42; diode 42, in turn, connects to the Memory unit 32, the AND gate 23, the oscillator 28 through a diode 43 and to the counters 11, 13, 15 and 17. With the counter 36 connected to the oscillator 28, it will generate, during a conversion cycle, a binary-decimal code equal to the difference between the previous value of the measured variable and the present value. This code is used in many direct digital control systems to compute the final element control signal.

To complete our analog to digital converter system, AND gates 44 and 46 are connected to the oscillator 28 and the shift register 7. The AND gate 44 has its output terminal connected to the counter 11 and the AND gate 46 connects to the counter 13.

In operation of our system, from the conversion attempt to the preceding analog signal, the logic input to AND gate 27, from the Memory unit 26, and the logic input to AND gate 23, from the Memory unit 32, are at the logic ZERO level. Intially, the stored value of the to-beconverted analog input signal will be transferred from the drum 5 to the shift register 7 and gated into the counters 11, 13, 15 and 17 through the gate 9. The shift register 7 also transfers a logic ONE instruction signal to either the AND gate 44 or the AND gate 46. For the present description, it will be assumed the AND gate 44 receives the logic ONE instruction signal and the AND gate 46 receives a logic ZERO instruction.

After the counters have been preset from the drum 5, the BD/A converter 18 converts the transferred binary-decimal code into an analog voltage. The null detector 19 compares the BD/A converter analog output signal with the signal to be converted. Assuming the input signal is greater than the BD/A converter output signal, then the output of the null detector 19 is logic ONE. A logic ONE output from the detector 19 causes the AND gate 22 and the AND gate 23 each to have a logic ONE input signal and a logic ZERO input signal. Logic NOT 21 inverts the logic ONE signal from the null detector 19 and causes the AND gate 41 to have two logic ZERO input signals. The system is now ready to convert the analog input signal into a binary-decimal code.

To start a conversion cycle, a logic ONE start pulse is connected to the AND gate 22, the AND gate 41 and the counter 36. The AND gate 22 now has two logic ONE inputs and its output changes from logic ZERO to logic ONE. This resets the Memory unit 26 and reverses its logic position, in addition, it starts the oscillator 28, sets the counters 11, 13, 15 and 17 to count up and connects a logic ONE signal to the AND gate 27. The AND gate 27 now has a logic ONE input signal and a logic ZERO input signal, its output signal will be at the logic ZERO level. Oscillator 28 generates a series of equally-spaced logic ONE signals which are connected to the counter 36 and to the AND gates 44 and 46. Since the AND gate 44 already has a logic ONE input, its output will be a series of pulses identical to those generated by the oscillator 28. The counter 11 begins to generate a new binary-decimal code representing the input signal, and the analog output of the BD/A converter 18 increases in millivolt steps. The counter 36 begins to generate a binary-decimal code equal to the difference between the previous value of the input signal and the present value.

The binary-decimal code and the analog signal from the BD/A converter will continue to increase in signal increment steps until one of two events occur; either the oscillator 28 generates twenty pulses or the generated analog value equals the input signal. When the generated analog voltage from the BD/A converter 18 equals the system input signal, the output of the null detector 19 changes from a logic ONE to logic ZERO. Immediately the output of the logic NOT 21 changes from logic ZERO to logic ONE and the AND gate 27 has two logic ONE inputs, one from the Memory unit 26. The output logic of the AND gate 27 changes from logic ZERO to logic ONE and the pulse Delay 31 generates a logic ONE pulse of fixed duration. This logic ONE signal resets the Memory unit 26 which in turn stops the oscillator 28.

In addition to resetting the Memory unit 26, the output of the pulse Delay 31 activates the pulse Delay 38 which generates a logic ONE output pulse of fixed duration. The conversion is finished and the Logic circuit 39 now takes over to determine the instruction code for the next cycle and return the counter data to the drum 5. First, the Logic circuit 39 compares the logic level of the pulse Delay 38 with the logic level of the counter 36. If the pulse Delay 38 has a logic ONE output and the counter 36 a logic ZERO output, then a null condition has been attained and the AND gate 44 will receive the logic ONE instruction during the next cycle. The Logic circuit 39 will store the logic instruction in the appropriate position on the drum 5 for use during the next cycle. If the binary-code in the counter 36 is to be used for purposes of digital control it would also be transferred, at this time, to the drum 5, through the register 7, or transferred to some part of a digital control system for computing the final element control signal.

If the oscillator 28 had generated twenty pulses before a null condition had been reached, the counter 36 would have a logic ONE output signal. This signal would activate the pulse Delay 31, and the Memory unit 26 would be reset as explained when a null condition was reached. The pulse Delay 38 would also generate a logic ONE signal which would be compared with the logic ONE signal of the counter 36 in the Logic circuit 39. In the next cycle, the logic ONE instruction code would be applied to the AND gate 46, the Logic circuit 39 would store this code in the appropriate drum position for use during this next cycle.

Assume one conversion attempt has been made and stopped by the 20 pulse limit of the counter 36, then, for the next cycle, the AND gate 23 and the AND gate 27 would each have a logic ONE input from the Memory units 32 and 26 respectively. The stored binary-decimal code from the previous conversion attempt would preset the counters 11, 13, 15 and 17 and the BD/A converter 18 would again convert this code to an analog signal. Instead of the AND gate 44 receiving the logic ONE instruction code, the AND gate 46 would now have a logic ONE input signal. The system input signal would be greater than the generated signal and the null detector 19 would have a logic ONE output. Assume, for descriptive purposes, that the input signal equals 36 millivolts and the BD/A converter output equals 34 millivolts, the level of the count reached during the first conversion attempt of this particular signal when the counter 36 stopped the counting process. The logic ONE null detector output and the logic ONE start signal would, as expected previously, change the logic level of the Memory unit 26, would start the oscillator 28, and set the counters 11, 13, 15 and 17 for a count-up procedure. With a logic ONE instruction code connected to the AND gate 46, each oscillator pulse increases the BD/A converter output by 10 millivolts. Thus, after one oscillator pulse the generated signal from the BD/A converter would be greater than the input signal and the null detector output would change from logic ONE to logic ZERO. AND gate 27 would have two logic ONE inputs; the Memory unit 26 would switch its logic level as a result of the logic output of the pulse Delay 31, thereby turning off the oscillator 28. The Logic circuit 39 would transfer the 34 plus 10 millivolt signal (in binary-decimal code) from the counters 11, 13, 15 and 17 to the magnetic drum 5. It would set the instruction code to count in single increment steps during the next cycle because counter 36 has a logic ZERO output indicating it did not stop the counting process.

Obviously the 44-millivolt signals stored in the magnetic drum 5 is incorrect since the input signal is 36 millivolts. It will, however, be transferred into the counters 11, 13, 15 and 17 prior to the third conversion attempt of the 36 millivolt input signal. For this third conversion attempt, all logic signal levels will be the same as in the first cycle, except the null detector output will be logic ZERO instead of logic ONE. When the logic ONE start signal is connected to the AND gates 22 and 41 only the latter will have two logic ONE inputs. The logic output of the AND gate 41 will now be logic ONE, this turns on the oscillator 28, presets the counters 11, 13, 15 and 17 to count-down (instead of up) and causes the AND gate 23 to have a logic ONE input signal. As during the first conversion, the oscillator pulses are again transferred through the AND gate 44 to the counter 11. Instead of the count increasing, however, it now decreases in single millivolt steps. Thus, the generated analog signal from the BD/A converter will decrease from the 44 millivolt starting level until it equals the 36 millivolt input signal. The null detector output now changes from logic ZERO to logic ONE and the AND gate 23 has two logic ONE input signals. It now generates the input pulse to the pulse Delay 31 which resets the Memory unit 32. The oscillator 28 is turned off and the conversion cycle is complete. The Logic circuit 39 has one logic ONE input from the pulse Delay 38 and one logic ZERO input from the counter 36. Under these conditions the logic ONE instruction code will be stored in the AND gate 44 position for use during the next cycle.

It should be obvious that our system can significantly increase the speed of analog to digital conversion. Each converted analog input signal is given a maximum of 20 pulses as generated by the oscillator 28. True, if the input has changed radically since the last conversion attempt it may take several cycles to complete a true conversion, this, however, will be the exception rather than the rule.

In accordance with the patent statutes, we have described our invention in terms of a preferred embodiment. It should be apparent to those skilled in the art that many changes may be made in the construction and arrangement of parts without departing from the scope of the invention as defined in the appended claims.

What we claim as new and desire to secure by Letters Patent of the United States is:

1. A high-speed analog-to-digital converter, comprising:

an analog signal source generating a signal varying in accordance with a measured variable;

information storage means having an input and output and wherein is stored a code representing the value of said measured variable;

means for generating a periodically varying signal;

counting means connected to said generating means for counting the periodic variations of said signal;

means connected to the output of said information storage means for transferring the stored value of said measured variable to said counting means thereby establishing a base to which said counting means adds the number of cycles of said periodic signal;

converting means connected to said counting means for converting said total count, including that transferred from said information storage means and that generated by said generating means, to a representative analog voltage signal;

null detecting means having two input connections and an output connection for comparing the analog signal from said converting means with the input signal from said analog signal source;

means responsive to the output of said null detector for stopping said generating means when said analog signals are of equal magnitude; and means connecting said counting means to the input of said storage means for transferring the total count accumulated in said counting means to said information storage means, so that a new base is established to which said counting means adds the number of cycles of said periodic signal to increase the scanning speed of said converter.

2. A high-speed analog-to-digital converter as set forth in claim 1 including count control means connected to said generating means and said counting means for varying the count weight of the cycles of said periodically varying signal.

3. A high-speed analog-to-digital converter, as set forth in claim 2, including timing means connected to said generating means for stopping said generator after a predetermined number of cycles.

4. A high-speed analog-to-digital converter, as set forth in claim 3, including logic means connected to said timing means and said null detecting means for establishing an instruction code based on whether said generator was stopped by said null detecting means or said timing means.

5. A high-speed analog-to-digital converter, as set forth in claim 4, including transfer means connected to said counting means and said logic means for transferring the final count and the instruction code to storage in said information storage means.

6. A high-speed information-feedback analog-to-digital converter, comprising:

an analog signal source generating a signal varying in accordance with a measured variable;

a magnetic drum for storing the digital representation of said analog signal;

means for generating a series of timed pulses;

binary-decimal counting means connected to said magnetic drum and said pulse generating means for adding to the digital representation from said magnetic drum the timed pulses from said generating means;

a digital-to-analog converter connected to said counting means for converting the digital signal of said counters to an equivalent analog signal;

a null detector connected to said digital-to-analog converter and said analog signal source for detecting when said converted digital signal is equal to the analog input signal, said null detector also connected to said generating means to stop the series of timed pulses when a null condition is detected; and means connected to said magnetic drum and said counters for transferring the binary-decimal code in said counters to said magnetic drum to be used in converting the analog input signal during a subsequent signal.

7. A high-speed information-feedback analog-to-digital converter, as set forth in claim 6, including timing means connected to said pulse generating means for stopping the generation of said timed pulses after a predetermined number.

8. A high-speed information-feedback analog-to-digital converter, as set forth in claim 7, including a logic circuit for determining which of two events occurred to stop the count of said generating means from proceeding to a higher value, said events being the timed limit and the existence of a null condition, upon the determination of which event occurred said logic circuit establishes an instruction code for controlling the converter's operation during the subsequent cycle.

9. A high-speed information-feedback analog-to-digital converter, comprising:

a magnetic drum for storing a binary-decimal code and an instruction code;

a plurality of binary-decimal counters, each having a count weight 10 times its predecessor and capable of counting up and counting down;

a shift register connected to said magnetic drum and said plurality of counters for transferring to said counters a binary-decimal code stored on said magnetic drum;

an oscillator generating a continuous train of equally-spaced pulses;

counter control means connected to said oscillator and said counters for controlling the count weight of each oscillator pulse;

a binary-decimal to analog converter connected to said counters for converting said binary code to its analog equivalent once each conversion cycle;

an analog signal source generating a signal varying in accordance with a measured variable;

a null detector connected to said signal source and said converter for comparing the magnitude of the two analog signals and generating a logic output signal;

a timing counter connected to said oscillator for counting the number of pulses generated thereby and in turn generating a logic output signal after a predetermined number of oscillator pulses; and oscillator control means responsive to the output of said null detector and said timing counter for controlling the on-off operation of said oscillator and the count-up and count-down operation of said binary-decimal counters for each conversion cycle.

10. A high-speed information-feedback analog-to-digital converter as set forth in claim 9 including logic means responsive to said oscillator control means and said timing counter for generating an instruction code for the next conversion cycle and for transferring the new binary-decimal code to said magnetic drum.

11. A high-speed information-feedback analog-to-digital converter as set forth in claim 9 wherein said timing counter includes means for generating a digital code equal to the difference between the code transferred from said magnetic drum and the code generated in said binary-decimal counters.

12. A high-speed information-feedback analog-to-digital converter as set forth in claim 11 including means for transferring the code difference signal from said timing counter to said magnetic drum for use as a system control signal.

References Cited

UNITED STATES PATENTS

| | | | |
|---|---|---|---|
| 2,922,990 | 1/1960 | Anderson | 340—347 X |
| 3,045,230 | 7/1962 | Tripp et al. | 340—347 |
| 3,064,191 | 11/1962 | Dever et al. | 340—347 X |
| 3,245,072 | 4/1966 | Fuller | 340—347 |
| 3,295,126 | 12/1966 | Spady | 340—347 |
| 3,359,552 | 12/1967 | Holt | 340—347 |

MAYNARD R. WILBUR, Primary Examiner

CHARLES D. MILLER, Assistant Examiner